United States Patent
Turner et al.

(10) Patent No.: US 12,124,174 B2
(45) Date of Patent: Oct. 22, 2024

(54) METROLOGY METHOD AND APPARATUS, COMPUTER PROGRAM AND LITHOGRAPHIC SYSTEM

(71) Applicant: ASML NETHERLANDS B.V., Veldhoven (NL)

(72) Inventors: Paul Jonathan Turner, Veldhoven (NL); Anagnostis Tsiatmas, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 552 days.

(21) Appl. No.: 17/438,994

(22) PCT Filed: Feb. 17, 2020

(86) PCT No.: PCT/EP2020/054087
§ 371 (c)(1),
(2) Date: Sep. 14, 2021

(87) PCT Pub. No.: WO2020/187514
PCT Pub. Date: Sep. 24, 2020

(65) Prior Publication Data
US 2022/0155694 A1  May 19, 2022

(30) Foreign Application Priority Data
Apr. 25, 2019 (EP) .................................. 19171061

(51) Int. Cl.
*G03F 7/00* (2006.01)
(52) U.S. Cl.
CPC ................ *G03F 7/70633* (2013.01)
(58) Field of Classification Search
CPC ............ G03F 7/70633; G03F 7/70616; G03F 7/70641; G03F 7/7065; G03F 7/70653; G03F 7/706833
(Continued)

(56) References Cited

U.S. PATENT DOCUMENTS

| 7,423,739 B2 | 9/2008 | Dirksen et al. |
| 8,014,881 B2 | 9/2011 | Baggen et al. |

(Continued)

FOREIGN PATENT DOCUMENTS

| CN | 101266410 | 9/2008 |
| CN | 102103330 | 6/2011 |

(Continued)

OTHER PUBLICATIONS

Office Action issued in corresponding Chinese Patent Application No. 202080022670.7, dated Nov. 24, 2023.
(Continued)

*Primary Examiner* — Paul Dinh
(74) *Attorney, Agent, or Firm* — Pillsbury Winthrop Shaw Pittman, LLP (57) ABSTRACT

A method, computer program and associated apparatuses for metrology. The method includes determining whether a substrate or substrate portion is subject to a process effect. The method includes: obtaining inspection data including a plurality of sets of measurement data associated with a structure on the substrate or portion thereof (for example measurement pupils); and obtaining fingerprint data describing a spatial variation of a parameter of interest. An iterative mapping of the inspection data to the fingerprint data is performed. Whether the structure is subject to a process effect is based on a degree to which the iterative mapping converges on a solution.

20 Claims, 5 Drawing Sheets

(58) Field of Classification Search
USPC .......................................................... 716/52
See application file for complete search history.

(56) References Cited

U.S. PATENT DOCUMENTS

| | | | |
|---|---|---|---|
| 8,554,510 B2 | 10/2013 | Staals et al. | |
| 8,856,694 B2 | 10/2014 | Ye et al. | |
| 2008/0077894 A1* | 3/2008 | Adel | G03F 7/70533 |
| | | | 716/52 |
| 2013/0124141 A1 | 5/2013 | Brill et al. | |
| 2016/0196379 A1 | 7/2016 | Adel et al. | |
| 2022/0035256 A1* | 2/2022 | Zhang | G03F 7/7085 |

FOREIGN PATENT DOCUMENTS

| | | |
|---|---|---|
| CN | 102799075 | 11/2012 |
| KR | 2014-0041847 | 4/2014 |
| TW | I266862 | 11/2006 |
| WO | 2013/029893 | 3/2013 |
| WO | 2018153711 | 8/2018 |
| WO | 2018192789 | 10/2018 |

OTHER PUBLICATIONS

International Search Report and Written Opinion issued in corresponding PCT Patent Application No. PCT/EP2020/054087, dated May 27, 2020.
Taiwanese Office Action issued in corresponding Taiwanese Patent Application No. 109107684, dated Oct. 21, 2020.
Lee, Hong-Goo, et al.: "Reduction of in-lot overlay variation with integrated metrology, and a holistic control Strategy", Proc. of SPIE, vol. 9635, pp. 96351S-96351S (2015).
Office Action issued in corresponding Korean Patent Application No. 10-2021-7030314, dated Apr. 25, 2024.

* cited by examiner

METROLOGY METHOD AND APPARATUS, COMPUTER PROGRAM AND LITHOGRAPHIC SYSTEM

CROSS-REFERENCE TO RELATED APPLICATIONS

This application is the U.S. national phase entry of PCT Patent Application No. PCT/EP2020/054087 which was filed on Feb. 17, 2020, which claims the benefit of priority of U.S. Patent Application No. 62/821,186 which was filed on Mar. 20, 2019, of U.S. Patent Application No. 62/828,817 which was filed on Apr. 3, 2019, and of European Patent Application No. 19171061.5 which was filed on Apr. 25, 2019, each of which is incorporated herein in its entirety by reference.

BACKGROUND

Field of the Invention

The present invention relates to methods and apparatuses for metrology usable, for example, in the manufacture of devices by lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction image or pattern from which a property of interest of the target can be determined.

In order that the radiation that impinges on to the substrate is diffracted, an object with a specific shape is printed on to the substrate and is often known as a scatterometry target or simply target. As mentioned above, it is possible to determine the actual shape of a scatterometry object using a cross-section scanning electron microscope and the like. However, this involves a large amount of time, effort and specialized apparatus and is less suited for measurements in a production environment because a separate specialized apparatus is required in line with normal apparatus in, for example, a lithographic cell.

Substrates may be subject to process effects and therefore have one or more process fingerprints or background fingerprints, which may result, for example, in unwanted and undesigned asymmetries in structures on the substrates. These process fingerprints may affect functioning of the device, either directly (e.g. film thickness dependent CDU impacting gate clock frequency), or indirectly (e.g. negatively affecting the control metrology performed to control and monitor the manufacturing process). For example, in an overlay control loop, it is difficult to separate these process fingerprints from overlay.

It would be therefore desirable to be able to obtain more information on such process fingerprints.

SUMMARY OF THE INVENTION

The invention in a first aspect provides a method of determining whether a substrate or substrate portion is subject to a process effect, the method comprising: obtaining inspection data comprising a plurality of sets of measurement data associated with a structure on the substrate or portion thereof; obtaining fingerprint data describing a spatial variation of a parameter of interest over a substrate or portion thereof; performing an iterative mapping of the inspection data to the fingerprint data; and determining whether the structure is subject to a process effect based on the degree to which the iterative mapping converges on a solution.

The invention in a second aspect provides a metrology apparatus operable to perform the method of the first aspect.

The invention further provides a computer program comprising processor readable instructions which, when run on suitable processor controlled apparatus, cause the processor controlled apparatus to perform the method of the first aspect, and a computer program carrier comprising such a computer program. The processor controlled apparatus may comprise the metrology apparatus of the second aspect Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
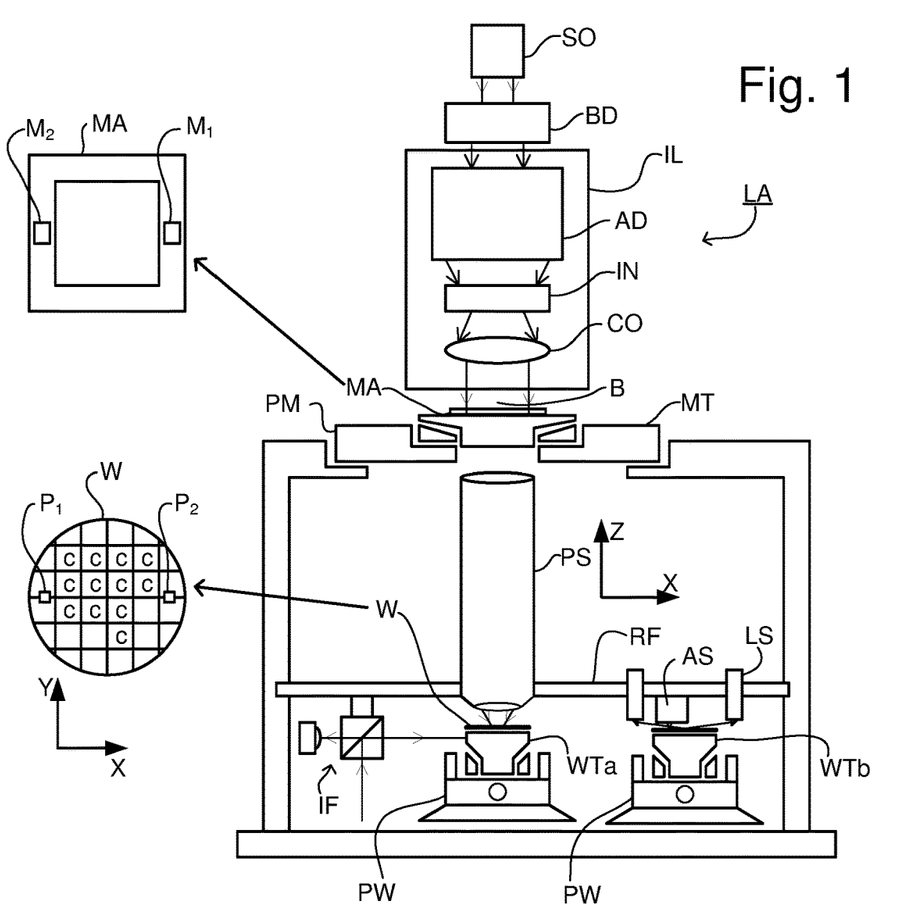
FIG. 1 depicts a lithographic apparatus.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
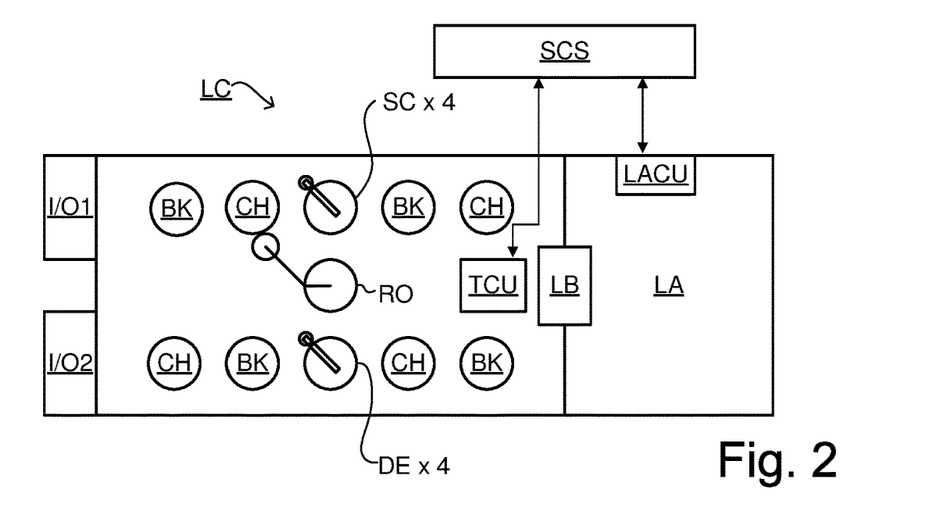
FIG. 2 depicts a lithographic cell.

As shown in FIG. 2, the lithographic apparatus LA forms part of a lithographic system, referred to as a lithographic cell LC or a lithocell. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
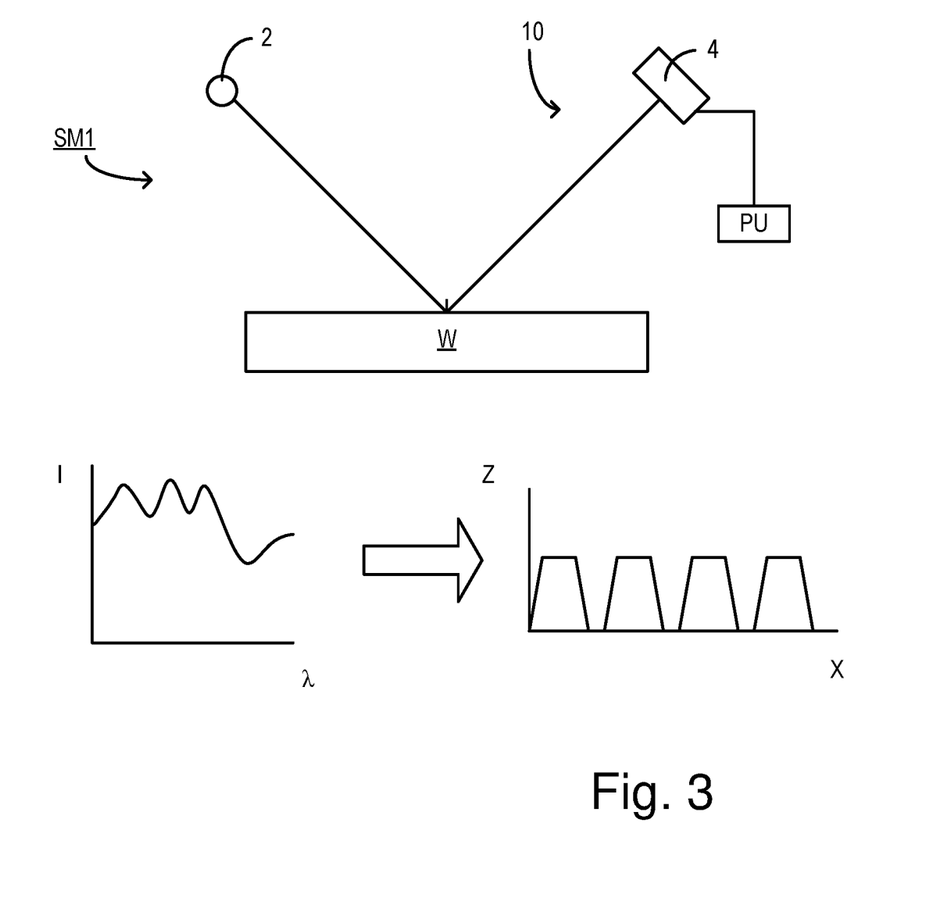
FIG. 3 depicts a first scatterometer.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
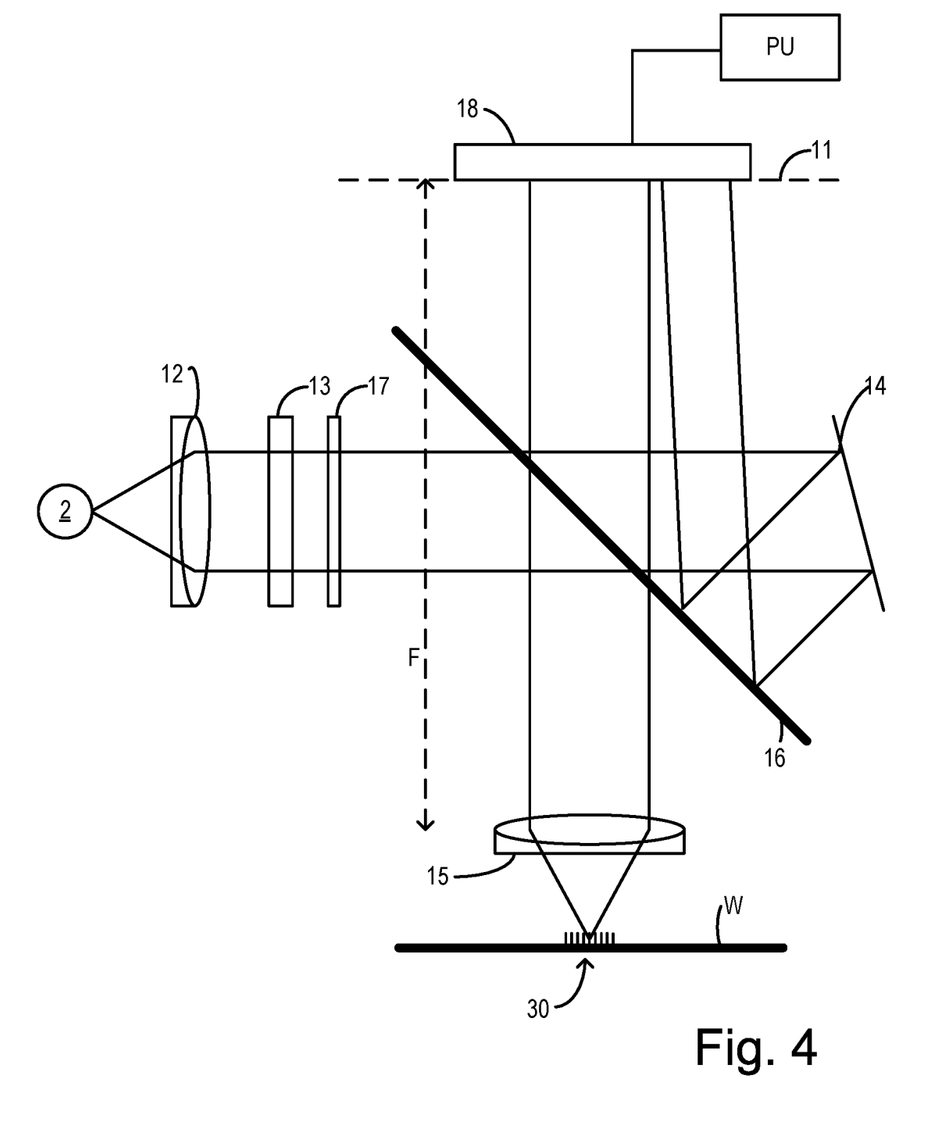
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay or focus metrology. Overlay metrology is a measuring system in which the overlay of two targets is measured in order to determine whether two layers on a substrate are aligned or not. Focus metrology determines the focus (and/or dose) setting used when forming the target. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using a scatterometer, such as that described above in combination with modeling of a target structure such as the target 30 and its diffraction properties, measurement of the shape and other parameters of the structure can be performed in a number of ways. An example of this process is described by FIG. 5. A diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a variation on this process, diffraction spectra for many different candidate structures can be calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
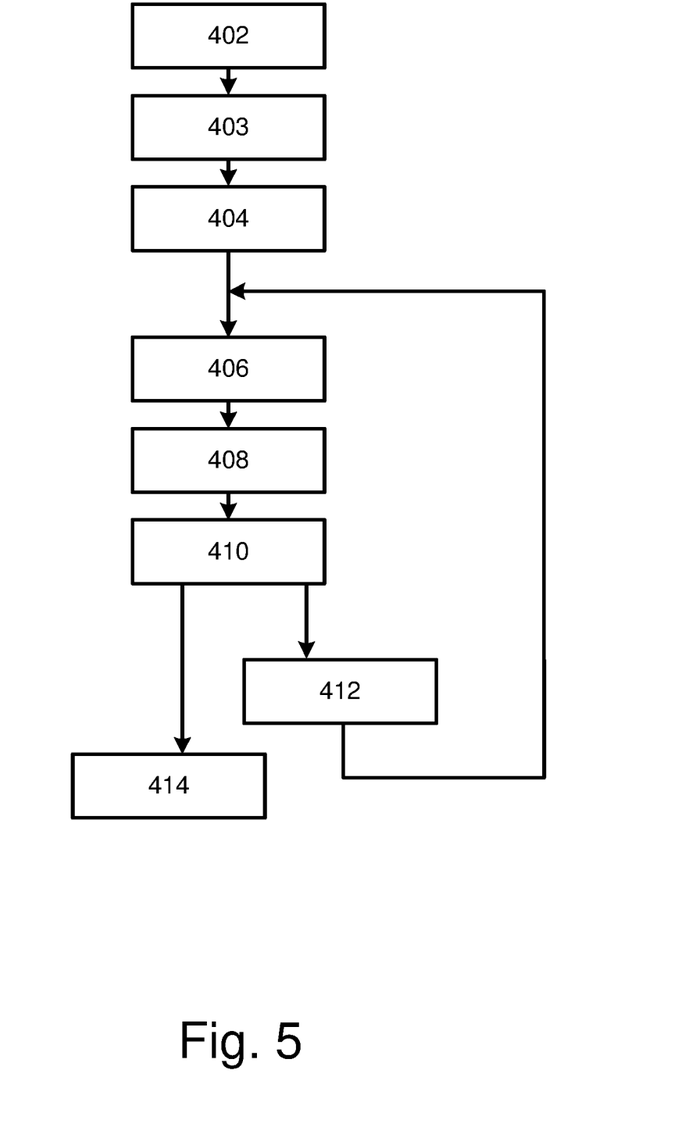
FIG. 5 is a flowchart depicting an example process for reconstruction of a structure from scatterometer measurements.

Throughout the description of FIG. 5, the term 'diffraction image' will be used, on the assumption that the scatterometer of FIG. 3 or 4 is used. Diffraction image is an example of an inspection data element within the context of this disclosure. The skilled person can readily adapt the teaching to different types of scatterometer, or even other types of measurement instrument.

FIG. 5 is a flowchart of the steps of a method of measurement of the target shape and/or material properties, described in summary. The steps are as follows, and are then described in greater detail thereafter:
- 402—Measure Diffraction Image;
- 403—Define Model Recipe;
- 404—Estimate Shape Parameters $\theta_0$;
- 406—Calculate Model Diffraction Image;
- 408—Compare Measured v Calculated Image;
- 410—Calculate Merit Function;
- 412—Generate Revised Shape Parameters $\theta_1$;
- 414—Report Final Shape Parameters The target will be assumed for this description to be periodic in only 1 direction (1-D structure). In practice it may be periodic in 2 directions (2-dimensional structure), and the processing will be adapted accordingly.

402: The diffraction image of the actual target on the substrate is measured using a scatterometer such as those described above. This measured diffraction image is forwarded to a calculation system such as a computer. The calculation system may be the processing unit PU referred to above, or it may be a separate apparatus.

403: A profile is established which defines a parameterized model of the target structure in terms of a number of parameters $\theta$. These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the profile will define many of these to have fixed values, while others are to be variable or 'floating' parameters for the purpose of the following process steps. Moreover, ways will be introduced in which parameters can be permitted to vary without being fully independent floating parameters. For the purposes of describing FIG. 5, only the variable parameters are considered as parameters $\theta$. The profile also defines the settings of the measurement radiation for a given target structure and how to estimate the parameter values by fitting the inspection data to the model.

404: A model target shape is estimated by setting initial values $\theta_0$ for the floating parameters. Each floating parameter will be generated within certain predetermined ranges, as defined in the recipe.

406: The parameters representing the estimated shape, together with the optical properties of the different elements of the model, are used to calculate the scattering properties, for example using a rigorous optical diffraction method such as RCWA or any other solver of Maxwell equations. This gives an estimated or model diffraction image of the estimated target shape.

408, 410: The measured diffraction image and the model diffraction image are then compared and their similarities and differences are used to calculate a "merit function" for the model target shape.

412: Assuming that the merit function indicates that the model needs to be improved before it represents accurately the actual target shape, new parameters $\theta_1$, etc. are estimated and fed back iteratively into step 406. Steps 406-412 are repeated.

In order to assist the search, the calculations in step 406 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

414: When the merit function indicates that this iterative process has converged on a solution with a desired accuracy, the currently estimated parameters are reported as the measurement of the actual target structure.

The computation time of this iterative process is largely determined by the forward diffraction model used, i.e. the calculation of the estimated model diffraction image using a rigorous optical diffraction theory from the estimated target structure. If more parameters are required, then there are more degrees of freedom. The calculation time increases in principle with the power of the number of degrees of freedom, although this can be alleviated if finite differences are used to approximate the Jacobian. The estimated or model diffraction image calculated at 406 can be expressed in various forms. Comparisons are simplified if the calculated image is expressed in the same form (e.g., spectrum, pupil image) as the measured image generated in step 402.

The creation of a profile involves multiple refinements of the profile, wherein the physical model is gradually adjusted to best represent the inspection data. The inspection data may comprise inspection data elements. The inspection data elements may be images, diffraction images (if diffraction based scatterometery is being used), spectra or pupil images; or else may be reconstructed parameter values obtained from such diffraction images etc. Each of the inspection data elements may be obtained by inspection of a corresponding target structure, e.g., using a scatterometer such as those described above. Each of these inspection data elements may be described by a plurality of intensity values. The adjustments are typically based upon the results of reconstructions. Reconstructions, as described, fit the model to the inspection data, thereby transforming the inspection data elements into parameter values. At the beginning of the procedure, reconstructions may fail as uncertainties may be large. It may therefore be more effective to reconstruct only one or a few measurements rather than the complete set of data.

To make a profile more robust, the nominal parameter values for the profile should be well chosen. Ideally, to properly estimate these nominal parameter values, many target structures should be reconstructed.

Another metrology technique comprises In Die Metrology (IDM). IDM is a specific metrology application typically used for measuring after-etch, in-device overlay between structures/layers in a semi-conductor process flow. This is accomplished by performing a measurement of a "pupil", which is an angularly-resolved Scatterometry signal collected by a suitable metrology tool (alternatively, image plane measurement values may be used). The tool focuses a spot of light onto a small sub-unit of actual product structures, rather than a dedicated metrology target and collects a pupil which comprises information about the structures illuminated by the spot.

The information that is projected onto the pupil plane is "mixed all together", such that no single pixel in the pupil comprises isolated information about any of the features on the wafer. In another application, described by FIG. 5, this information is "reconstructed" by building a parameterized version of the device structures, and running that model through a simulation engine to generate a "simulated pupil". An optimization engine then uses the difference between the measured pupil and the simulated pupil to drive the model parameters and iteratively attempt to determine what is on the wafer.

However, such reconstructions are notoriously difficult to get right and take a significant amount of time to setup. The cost/benefit ratio is unbalanced (too hard to setup, and the resultant data is sometimes questionable) for most applications. In addition, it was found that the current models used by in reconstruction, typically used to reconstruct CD, were technologically insufficient to simulate the extremely small signals used to extract overlay information (they were optimized for symmetric parameter extraction rather than asymmetric parameter extraction). As such, the aforementioned reconstruction techniques are typically only used to monitor film thickness, nk, and/or CD. They do not deliver good recipes to report asymmetric process parameters (e.g. 3DNAND pillar tilt). Because of these issues, IDM techniques (such as IDM-Overlay, for measuring overlay) use a "data-driven" recipe setup approach.

Asymmetric process parameters (line/pillar tilt, bottom grating asymmetry (BGA), side wall angle (SWA) asymmetry, pitch-walking, etc.) are nuisances, because, typically, nothing is designed to be asymmetric, and as such, many metrology tools assume symmetric structures. Because it is difficult to directly measure these asymmetric process fingerprints using present strategies and tools, only the impacts of these fingerprints are detected (large residuals, wafer-to-wafer overlay variation, etc.). Providing information on these process fingerprints is therefore highly valuable, even if that information not perfect.

Figure 6:
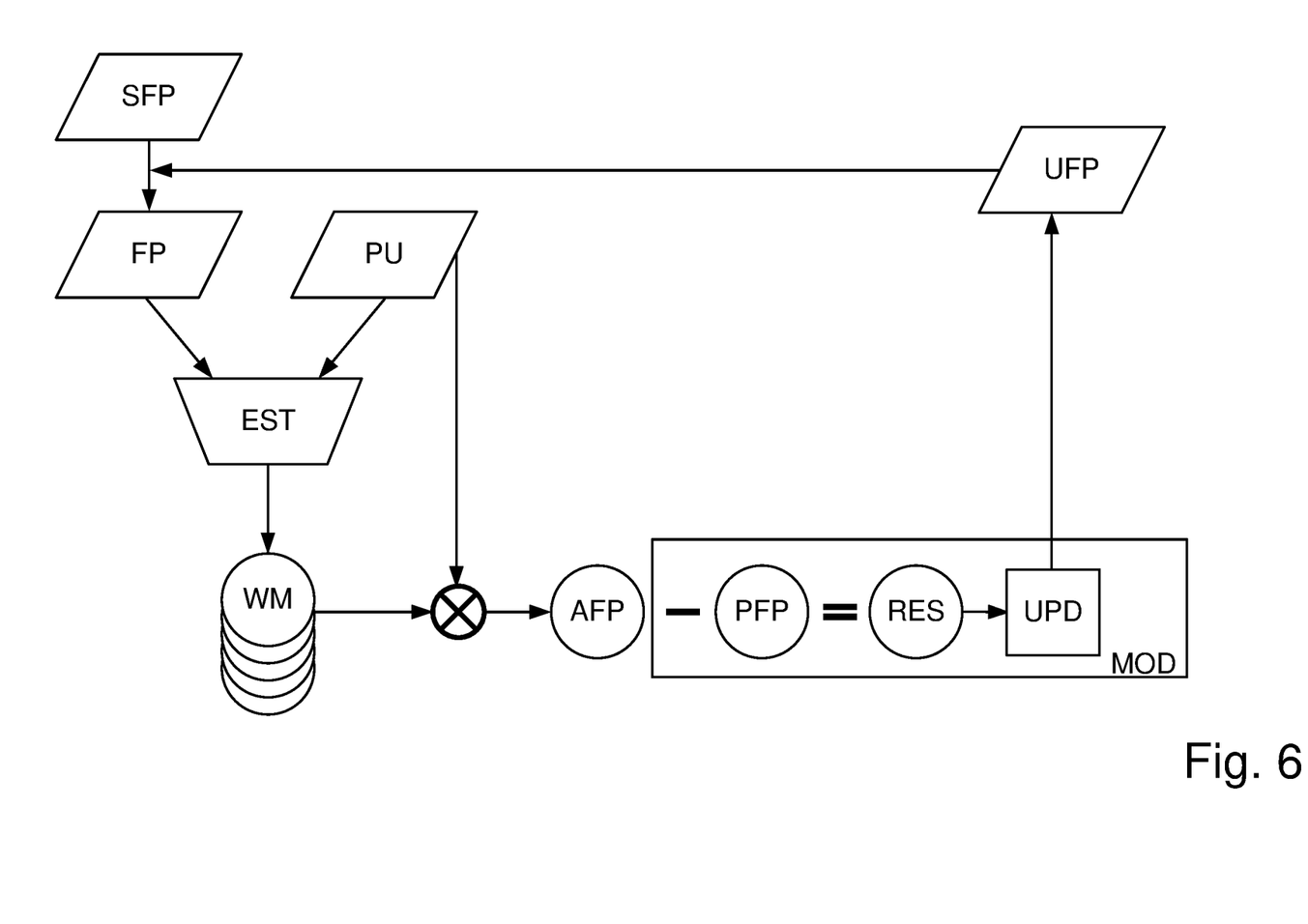
FIG. 6 is a flowchart describing an in-device metrology method used in embodiments of the invention.

An iterative training process for in-die metrology, is described by FIG. 6. This shows the metrology data or pupils PU and a parameter fingerprint FP (or error file derived from a fingerprint), such as an overlay fingerprint, being fed into an estimator EST. An overlay fingerprint, in this context, may comprise a description of overlay over a wafer or portion thereof (e.g., a field); for example it may comprise a set of overlay values over the substrate or field. In a first iteration, the fingerprint FP input to the estimator EST may comprise an initial fingerprint SFP such as any initial estimate or guess. In an overlay example, this initial estimate may simply comprise the scanner set overlay values (i.e., a deliberate bias or deliberate overlay imposed to aid metrology calculations). For other process fingerprints the initial fingerprint SFP may be derived from a multitude of sources, including but not limited to historically significant process fingerprints, other semi-conductor processing tools (e.g. etch chamber chuck heating parameters), other metrology tools (e.g. thin film thickness measurements).

The estimator calculates one or more weight maps WM or recipes, which describe a mapping of the pupil PU to the fingerprint FP (i.e., to overlay or other parameter of interest values). Multiple weight maps WM may be calculated, for example, for multiple pupils PU of the same structure captured under different illumination conditions (e.g., different wavelengths, polarizations, angles of incidence etc. or combinations thereof). One or more of these pupils may vary significantly from others, even though they are obtained from a measurement of the same structure.

Once the weight maps WM are calculated, they are combined with the pupils PU, and averaged, to obtain an averaged fingerprint AFP. This is fed back iteratively as an updated fingerprint UFP to the estimator. This is performed until convergence, yielding a final weight map and fingerprint, or until a pre-defined number of iterations is performed without achieving convergence. As illustrated, in each iteration, rather than feeding this raw averaged fingerprint directly, a modelling step MOD may be performed. The modelling step may calculate fingerprint residuals RES from the difference of the averaged fingerprint AFP and the fingerprint PFP used in the previous iteration (e.g., the scanner set overlay SFP for the first iteration) yields. This residual RES is used to update the model UPD to determine the updated fingerprint UFP. The updated fingerprint UFP is used as fingerprint FP in the next iteration.

A correction may be applied to the fingerprint FP at one or more iterations (e.g., each iteration), which accounts for the error between the true fingerprint on the wafer and the fingerprint SFP/FP used for that iteration. Such a correction may comprise a wafer background fingerprint correction WBFC, and may be performed, for example, by the estimator EST or as part of the modelling step MOD. The correction may operate by dynamically modifying the fingerprint FP according to a model, so as to improve the results, and as such can be seen as a mechanism to compensate for the "non-perfect" initial estimate of the fingerprint SFP. The correction, for example, may use a Principal Component Analysis (PCA) on the raw pupils as the wafer background fingerprint tends to be orthogonal to the overlay fingerprint being sought. As such, the estimator EST may comprise a correction mechanism enabling the fingerprint FP to float according to some model parameters (e.g., use the initial fingerprint SFP and update based on the WBFC mechanism).

It has been determined that the aforementioned method, including the WBFC step, converges on a solution more quickly (fewer iterations) if the initial estimate is closer to the actual fingerprint (solution) than farther away. It has also been shown that process fingerprints which generate a large amount of signal in the pupil plane require less accuracy for the initial fingerprint estimate SFP Taking this to an extreme, the inventors have observed that inputting a random fingerprint (random overlay values) as an initial estimate SFP for the iterative solver of FIG. 6, can result in convergence on a solution. In other words, if the process fingerprint can be described by the model parameters in the correction (e.g., WBFC) mechanism, and if the signal strength is sufficiently strong, meaningful process fingerprint information can be extracted with no prior knowledge of what the fingerprint looks like.

The inventors have surmised that this observation could be used to obtain useful data on the process effects. By inputting a "background fingerprint" or "process fingerprint". i.e., a fingerprint describing something other than overlay, it can be determined whether that fingerprint is present in (or described by) the pupil data being measured. In addition, an estimation as to the degree to which such a fingerprint is present (e.g., its dominance in the data) and/or the location of a particular identified fingerprint/process effect can be determined. The process fingerprint inputted could be any known fingerprint (or component thereof), e.g., seen in historic data and/or polynomials such as Zernike polynomials, Legendre polynomials or Bessel functions. The fingerprints may describe, for example, wafer effects (wafer fingerprints) and/or field effects (field fingerprints). The iterative process, and correction therein, tends to ensure convergence on the principal component of the fingerprint. Where an input is something other than overlay, this first principal component is likely to correspond to something other than overlay, and in particular a wafer background effect or process effect.

In an embodiment, it is proposed that a library is constructed comprising many examples of such fingerprints and components thereof. As the required knowledge of the underlying background fingerprint of interest needed to generate a wafer map does not need to be total, but only a sufficiently close initial estimate or guess, such library fingerprints can be inputted into the FIG. 6 flow (i.e., as initial fingerprint SFP) to see which converge, and how quickly. It is not expected that the principal components within the process fingerprint library contain the full fingerprint, only the initial "seeds". How well the pupil-mapping estimator EST converges indicates how strongly the input signal exists on the wafer. If a "fingerprint seed" is inputted which correlates strongly to an actual fingerprint on the wafer, the Estimator will converge to a good recipe quickly; conversely if a fingerprint seed is inputted which does not correlate to any real parameter on the wafer, the pupil mapping results will be very poor. By "injecting" signal (process fingerprints) into the pupil-mapping tool and seeing which ones converge, it becomes possible to extract process-fingerprint information without any a priori knowledge of the process fingerprint.

Such a library may comprise, for example, numerous examples of one, some or all of the following:
 Zernike Polynomials (wafer fingerprints);
 Bessel Functions (wafer fingerprints);
 Legendre Polynomials (field fingerprints);
 Principal Components from PCA analyses from various metrology sources;
 Known process fingerprints;
 Historical process fingerprints;
 Predictions of process fingerprints;
 Any random patterns or values.

At present, large databases comprising metrology data from multiple sources (scanner/etcher/thin film deposition/Scatterometry/etc.) are being constructed in any case, and it is proposed that such databases could be used to construct the proposed library.

Once constructed, library fingerprints can be injected into the process described by FIG. 6, to find wafer maps/recipes which correlate with these library fingerprints; e.g., as part of a brute force search where each library fingerprint is inputted. Such a search method may comprise the setting of a convergence criteria. The convergence criteria may be set in terms of the number of iteration/speed of convergence and/or size of the residual. For example thresholds could be set for one or both these convergence criteria. Library fingerprints may, for example, be considered present when the process loop converges on a wafer map within a threshold maximum number of iterations and/or results in a minimum residual value (e.g., in terms of average over the wafer or a portion thereof, such as per field). Such a process can be done in parallel with IDM, or other metrology, e.g., using the same pupils. As such, no additional metrology effort is necessary.

The strongest signals found while searching the process fingerprint library can be reported in parallel to any overlay (or other parameter of interest) value. These can be tracked and used to determine control strategies or corrections, and/or determine a root cause (e.g., to setup A/B testing). This may be particularly valuable for asymmetric process fingerprints as typically nothing is designed to be asymmetric, so any observed asymmetry indicates a nuisance parameter which needs to be controlled/corrected.

In a particular use case, with respect to 3D structures such as 3DNAND, it has been observed that one source of process asymmetry (process effect) is pillar tilt, and further that this pillar tilt directly corresponds to on-product overlay. Therefore, the proposed method can be used to provide a feedback mechanism to control the pillar tilt (e.g., by injecting a process fingerprint or component thereof relating to pillar tilt), with the results also being used as a measure of overlay, and therefore used to monitor/control on-product overlay.

Therefore, described is a concept which enables extraction of the largest sources of process asymmetry and map them to wafer positions, without any initial knowledge of the kind of process fingerprints which might exist on the wafer, and without the need for additional metrology (i.e., based on the same pupils as used to perform the metrology as part of a control or monitoring action). It also can provide knowledge of on-wafer structures which fall outside of the expected model-domain.

While the method has been described in terms of the iterative method of FIG. 6, it should be appreciated that model-based OCD calculations, such as described in FIG. 5 could also extract the same information and therefore such methods fall within the scope of this disclosure.

In association with the physical grating structures of the target structures as realized on substrates and patterning devices, an embodiment may include a computer program containing one or more sequences of machine-readable instructions describing methods of measuring target structures on a substrate and/or analyzing measurements to obtain information about a lithographic process. This computer program may be executed for example within unit PU in the apparatus of FIG. 3 or FIG. 4 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3 or FIG. 4, is already in production and/or in use, the invention can be implemented by the provision of updated computer program products for causing a processor to perform the methods as described above and as claimed.

Further embodiments of the invention are disclosed in the list of numbered clauses below:

1. A method of determining whether a substrate or substrate portion is subject to a process effect, the method comprising:
   obtaining inspection data comprising a plurality of sets of measurement data associated with a structure on the substrate or portion thereof;
   obtaining fingerprint data describing a spatial variation of a parameter of interest over a substrate or portion thereof;
   performing an iterative mapping of the inspection data to the fingerprint data; and
   determining whether the substrate is subject to a process effect based on the degree to which the iterative mapping converges on a solution.
2. A method according to clause 1, wherein said plurality of sets of measurement data comprise sets of measurement data relating to a plurality of different locations on the substrate.
3. A method according to clause 2, wherein said plurality of sets of measurement data comprises sets of measurement data obtained from some or each of said plurality of different locations on the substrate using a different one of multiple acquisition settings.
4. A method according to clause 1, 2, or 3, wherein each set of measurement data comprises angularly resolved intensity values.
5. A method according to any preceding clause, wherein said fingerprint data relates to a fingerprint of a known process effect.
6. A method according to any preceding clause, wherein said fingerprint data has been obtained from previous measurement data relating to at least one previous measurement of the known process effect.
7. A method according to clause 6, wherein said fingerprint data comprises a principal component of said previous measurement data.
8. A method according to any preceding clause, wherein said fingerprint data comprises polynomial data.
9. A method according to clause 8, wherein said polynomial data comprises a Zernike polynomials, Legendre polynomials or Bessel functions.
10. A method according to any preceding clause, wherein said fingerprint data comprises substrate fingerprint data describing a spatial variation of the parameter of interest over the substrate.
11. A method according to any preceding clause, wherein said fingerprint data comprises field fingerprint data describing a spatial variation of the parameter of interest over a field.
12. A method according to any preceding clause, wherein said iterative mapping yields one or more weight maps for each iteration.
13. A method according to any preceding clause, wherein said step of performing an iterative mapping comprises calculating a correction for a wafer background fingerprint, which corrects for fingerprint contributors other than said parameter of interest.
14. A method according to clause 13, wherein said correction for a wafer background fingerprint comprises performing a component analysis.
15. A method according to clause 14, wherein said correction for a wafer background fingerprint comprises removing one or more principal components other than the first principal component, when determining an updated fingerprint for each iteration of the iterative mapping.
16. A method according to any preceding clause, wherein said determining whether the structure is subject to a process effect is based on a convergence criteria.
17. A method according to any preceding clause, comprising determining one or more values for the parameter of interest based on said inspection data.
18. A method according to any preceding clause, wherein said fingerprint data is obtained from a library of multiple sets of fingerprint data.

19. A method according to clause 18, wherein said multiple sets of fingerprint data comprises multiple examples of one, some or all of the following: Zernike Polynomials, Bessel Functions, Legendre Polynomials, Principal Components from principal component analyses of metrology data relating to one or more metrology sources; Known process fingerprints; Historical process fingerprints; and Predictions of process fingerprints; random values.

20. A method according to clause 18 or 19, comprising repeating said method for each of different ones of said multiple sets of fingerprint data.

21. A method according to clause 20, comprising setting a convergence criteria for said determining whether the structure is subject to a process effect based on the number of iteration and/or size of the residual.

22. A method according to clause 21, comprising reporting the strongest one or more sets of fingerprint data according to said convergence criteria.

23. A method according to clause 22, comprising determining control strategies or corrections, and/or determining a root cause for said strongest one or more sets of fingerprint data.

24. A method as claused in any of clauses 18 to 23, comprising the initial step of constructing said library.

25. A method according to any preceding clause, wherein the parameter of interest is overlay.

26. A method according to any preceding clause, wherein each set of measurement data relates to a pupil plane.

27. A metrology apparatus being operable to perform the method of any of clauses 1 to 26.

28. A metrology apparatus according to clause 27 comprising:
a support for a substrate having a plurality of target structures thereon;
an optical system for measuring each target structure; and
a processor arranged to perform said method of any of clauses 1 to 26.

29. A computer program comprising processor readable instructions which, when run on suitable processor controlled apparatus, cause the processor controlled apparatus to perform the method of any one of clauses 1 to 26.

30. A computer program carrier comprising the computer program of clause 29.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
obtaining inspection data comprising a plurality of sets of measurement data associated with a structure on a substrate or portion thereof;
obtaining fingerprint data describing a spatial variation of a parameter of interest over the substrate or portion thereof;
performing, by a hardware computer system, an iterative mapping of the inspection data to the fingerprint data; and
determining whether the substrate is subject to a process effect based on a degree to which the iterative mapping converges on a solution.

2. The method as claimed in claim 1, wherein the plurality of sets of measurement data comprise sets of measurement data relating to a plurality of different locations on the substrate.

3. The method as claimed in claim 2, wherein the plurality of sets of measurement data comprises sets of measurement data obtained from some or each of the plurality of different locations on the substrate using a different one of multiple acquisition settings.

4. The method as claimed in claim 1, wherein each set of measurement data comprises angularly resolved intensity values.

5. The method as claimed in claim 1, wherein the fingerprint data relates to a fingerprint of a known process effect.

6. The method as claimed in claim 1, wherein the fingerprint data has been obtained from previous measurement data relating to at least one previous measurement of a known process effect.

7. The method as claimed in claim 1, wherein the iterative mapping yields one or more weight maps for each iteration.

8. The method as claimed in claim 1, wherein the performing an iterative mapping comprises calculating a correction for a substrate background fingerprint, which corrects for fingerprint contributors other than the parameter of interest.

9. The method as claimed in claim 1, wherein the fingerprint data is obtained from a library of multiple sets of fingerprint data.

10. The method as claimed in claim 9, wherein the multiple sets of fingerprint data comprises multiple examples of one, some or all of the following: Zernike polynomials, Bessel functions, Legendre polynomials, principal components from principal component analyses of metrology data relating to one or more metrology sources; known process fingerprints; historical process fingerprints; predictions of process fingerprints; and/or random values.

11. The method as claimed in claim 9, comprising repeating the method for each of different ones of the multiple sets of fingerprint data.

12. The method as claimed in claim 11, comprising setting a convergence criteria for the determining whether the structure is subject to a process effect based on a number of iterations and/or size of a residual.

13. The method as claimed in claim 12, comprising reporting one or more sets of fingerprint data according to the convergence criteria.

14. The method as claimed in claim 13, further comprising determining one or more control strategies or one or more corrections, and/or determining a root cause for the reported one or more sets of fingerprint data.

15. The method as claimed in claim 1, wherein the parameter of interest is overlay and each set of measurement data relates to a pupil plane.

16. A computer program product comprising a non-transitory computer-readable medium comprising processor readable instructions therein, the instructions, when run on suitable processor controlled apparatus, are configured to cause the processor controlled apparatus to at least:

obtain inspection data comprising a plurality of sets of measurement data associated with a structure on a substrate or portion thereof;

obtain fingerprint data describing a spatial variation of a parameter of interest over the substrate or portion thereof;

perform an iterative mapping of the inspection data to the fingerprint data; and determine whether the substrate is subject to a process effect based on a degree to which the iterative mapping converges on a solution.

17. The computer program product as claimed in claim 16, wherein the plurality of sets of measurement data comprise sets of measurement data relating to a plurality of different locations on the substrate.

18. The computer program product as claimed in claim 16, wherein each set of measurement data comprises angularly resolved intensity values.

19. The computer program product as claimed in claim 16, wherein the fingerprint data relates to a fingerprint of a known process effect.

20. The computer program product as claimed in claim 16, wherein the iterative mapping yields one or more weight maps for each iteration.

* * * * *

UNITED STATES PATENT AND TRADEMARK OFFICE
CERTIFICATE OF CORRECTION

PATENT NO. : 12,124,174 B2
APPLICATION NO. : 17/438994
DATED : October 22, 2024
INVENTOR(S) : Paul Jonathan Turner et al.

Page 1 of 1

It is certified that error appears in the above-identified patent and that said Letters Patent is hereby corrected as shown below:

On the Title Page

Item (60) Related Application Data:
Please include -- Provisional application No. 62/821,186, filed on March 20, 2019; Provisional application No. 62/828,817, filed on April 3, 2019 --.

Signed and Sealed this
Twenty-sixth Day of August, 2025

Coke Morgan Stewart
*Acting Director of the United States Patent and Trademark Office*